(12) United States Patent
Lesso et al.

(10) Patent No.: US 12,184,272 B2
(45) Date of Patent: Dec. 31, 2024

(54) SWITCHING TRANSDUCER DRIVER

(71) Applicant: Cirrus Logic International Semiconductor Ltd., Edinburgh (GB)

(72) Inventors: John P. Lesso, Edinburgh (GB); Douglas J. W. Macfarlane, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 18/308,395

(22) Filed: Apr. 27, 2023

(65) Prior Publication Data
US 2024/0364328 A1    Oct. 31, 2024

(51) Int. Cl.
*H03K 17/687* (2006.01)
*H03K 19/00* (2006.01)
*H03K 19/0185* (2006.01)

(52) U.S. Cl.
CPC ....... *H03K 17/687* (2013.01); *H03K 19/0005* (2013.01); *H03K 19/018585* (2013.01)

(58) Field of Classification Search
CPC ............. H03K 17/687; H03K 19/0005; H03K 19/018585
See application file for complete search history.

(56) References Cited

U.S. PATENT DOCUMENTS

| | | | | |
|---|---|---|---|---|
| 2013/0216076 A1* | 8/2013 | Knudsen | ............... | H04R 25/30 381/312 |
| 2013/0265855 A1* | 10/2013 | Ghisu | ............... | H03K 17/6872 367/137 |
| 2017/0117851 A1* | 4/2017 | Høyerby | ............... | H03F 3/2173 |

FOREIGN PATENT DOCUMENTS

CN    115763557 A    *    3/2023

OTHER PUBLICATIONS

Partial International Search and Provisional Opinion of the International Searching Authority, International Application No. PCT/EP2024/059664, mailed Jun. 28, 2024.

* cited by examiner

*Primary Examiner* — Metasebia T Retebo
(74) *Attorney, Agent, or Firm* — Jackson Walker L.L.P.

(57) ABSTRACT

A switching transducer driver operable in: a first mode in which first and second output stage switches are controlled to generate a two-level output signal, wherein an impedance of the first output stage switch is substantially the same as an impedance of the second output stage switch; and a second mode in which the first and second output stage switches and a third switch are controlled to generate a three-level output signal, wherein an impedance of the third switch is substantially greater than the impedance of the first output stage switch and the second output stage switch.

20 Claims, 7 Drawing Sheets

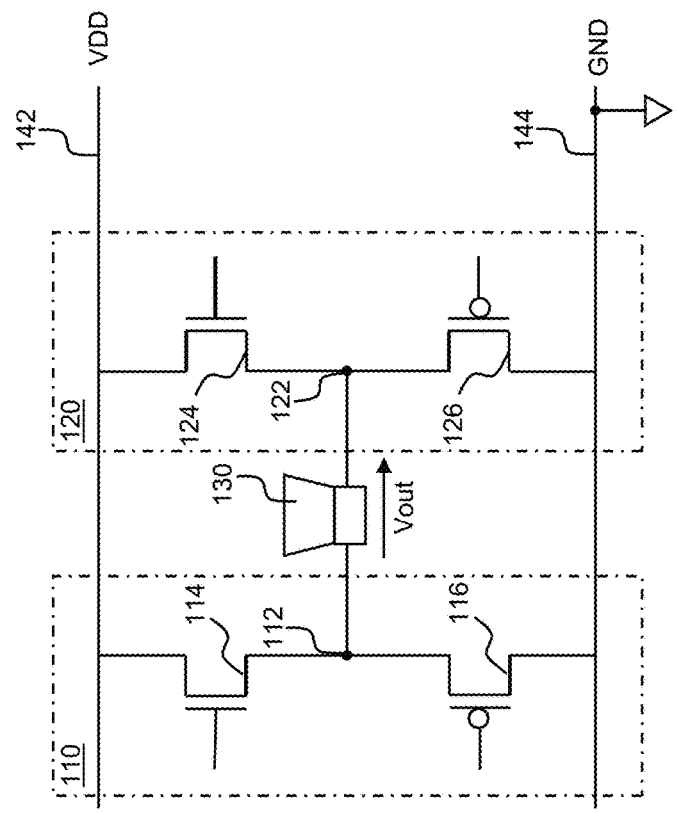
Figure 1 (Prior Art)

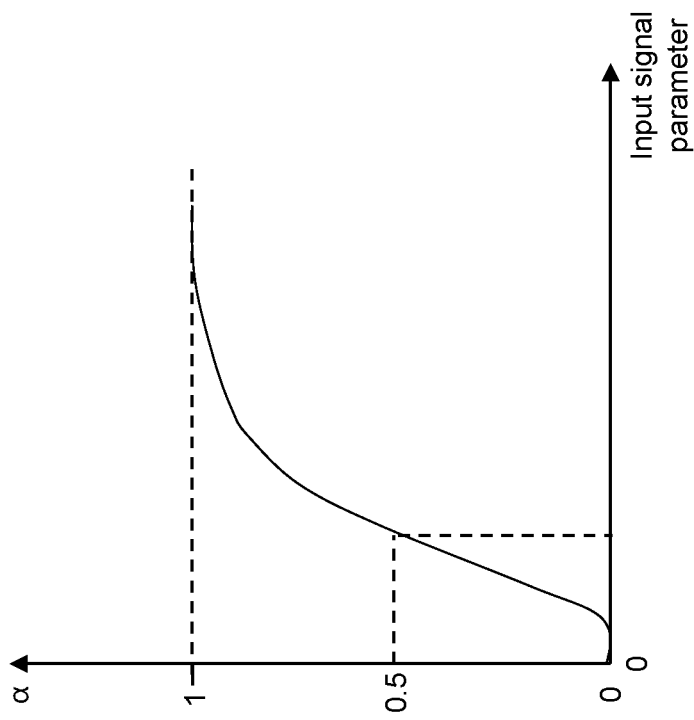
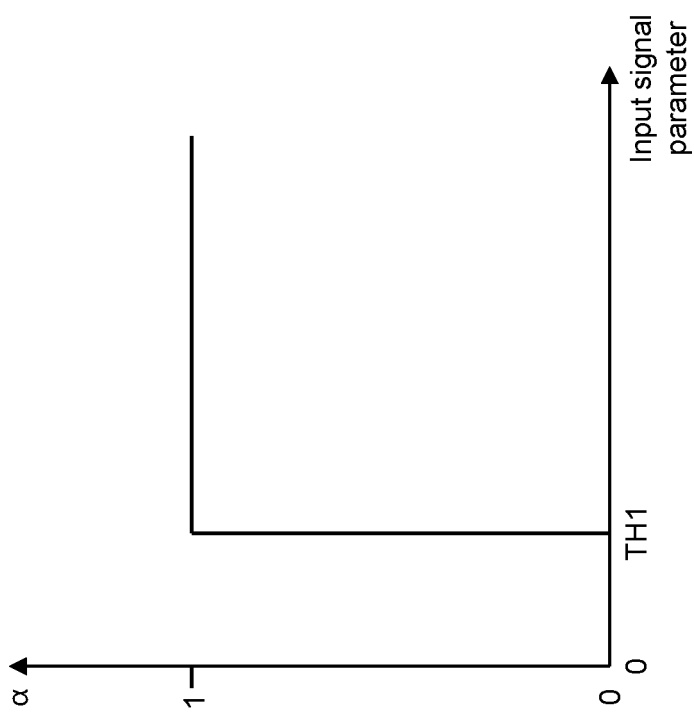
Figure 6a
Figure 6b

SWITCHING TRANSDUCER DRIVER

FIELD OF THE INVENTION

The present disclosure relates to a switching transducer driver.

BACKGROUND

Switching transducer drivers such as Class D amplifiers are increasingly being used in electronic devices for which power efficiency is important, such as mobile telephones, portable media players, laptop and tablet computers, wireless headphones, earphones and earbuds. Such transducer drivers are also increasingly finding use in automotive applications, e.g. in vehicle audio systems and the like.

A typical switching transducer driver (e.g. a Class D amplifier) includes a modulator stage and an output stage. In low-power applications such as portable audio devices it is common for the output stage to be implemented as a full-bridge output stage, with a load such as a speaker being coupled in a bridge-tied load configuration between first and second half bridges.

FIG. 1 is a schematic representation of a full bridge output stage 100 comprising a first half-bridge 110 and a second half-bridge 120, which together provide a differential output voltage Vout for driving a bridge-tied load 130 (e.g. a loudspeaker) that can be coupled between respective output nodes 112, 122 of the first and second half-bridges 110, 120.

The first half-bridge 110 comprises a high-side switch 114 coupled in series with a complementary low-side switch 116 between a first supply voltage (VDD) rail 142 and a reference voltage (e.g. ground) rail 144 of the output stage 100. The high-side switch 114 and the low-side switch 116 may be, for example, complementary MOSFET devices.

Similarly, the second half-bridge 120 comprises a high-side switch 124 coupled in series with a complementary low-side switch 126 between the first supply voltage (VDD) rail 142 and the reference voltage (e.g. ground) rail 144 of the output stage 100. Again, the high-side switch 124 and the low-side switch 126 may be, for example, complementary MOSFET devices.

In use of the output stage 100, control signals such as pulse width modulation (PWM) signals are supplied to control terminals (e.g. gate terminals) of the high-side switch 114 and low-side switch 116 of the first half-bridge 110, and to control terminals (e.g. gate terminals) of the high-side switch 124 and the low-side switch 126 of the second half-bridge 120. The control signals are arranged such that when the high-side switch 114 is switched on in response to a control signal at its control terminal, the low-side switch 116 is switched off, and vice versa. Thus, in operation of the first half-bridge 110, the output node 112 will be at either the first supply voltage (VDD) or the reference voltage (e.g. ground), depending upon whether the high-side switch 114 or the low-side switch 116 is switched on. Similarly, in operation of the second half-bridge 120, the output node 122 will be at either the first supply voltage (VDD) or the reference voltage (e.g. ground), depending upon whether the high-side switch 124 or the low-side switch 126 is switched on. The output voltage Vout across the load 130 can thus take any of three levels: +VDD, −VDD or 0V (assuming that the reference voltage rail 144 is coupled to ground).

In some low-power applications the output stage 100 may be implemented in integrated circuitry (e.g. in a single integrated circuit) comprising the switches 114, 116, 124, 126. In some examples, such integrated circuitry may also comprise modulator circuitry for supplying the control signals to the switches 114, 116, 124, 126 of the output stage 100.

In higher power applications (e.g. automotive audio applications) it may be beneficial to use a single-ended output stage of the kind shown schematically in FIG. 2.

As shown in FIG. 2, the single-ended output stage 200 in this example comprises a half-bridge 210 having a high-side switch 212 coupled in series with a complementary low-side switch 214 between a first, positive (+VDD) supply voltage rail 222 and a second, negative (−VDD) supply voltage rail 224 of the single-ended output stage 200. The high-side switch 212 and the low-side switch 214 may be, for example, complementary MOSFET devices.

In use of the single-ended output stage 200, a load 230 such as a loudspeaker is coupled between an output node 216 of the half-bridge 210 and a reference voltage (e.g. ground) rail 226 of the single-ended output stage 200. In the example shown in FIG. 2 low-pass filter circuitry 240 comprising an inductor 242 and a capacitor 244 is coupled between the output node 216 and the load 230, to attenuate high frequency components that may be present in an output signal of the half-bridge 210 due to the switching frequency of the switches 212, 214.

Unlike the full bridge output stage 100 of FIG. 1, the single-ended output stage 200 of FIG. 2 requires a negative (−VDD) supply voltage rail 224. As will be appreciated by those skilled in the art, this may increase the complexity of the single-ended output stage 200, as compared to the full bridge output stage 100 of FIG. 1. However, the single-ended output stage 200 may be more cost effective than the full bridge output stage 100. In particular, where multiple channels are required (e.g. in an application such as a multi-channel audio system where multiple different loads such as loudspeakers are to be driven) it may be more cost effective to use one single-ended output stage of the kind shown in FIG. 2 per channel, with the negative (−VDD) supply voltage rail 224 being shared between all the channels, than to provide multiple full bridge output stages.

In operation of the single-ended output stage 200, control signals (e.g. PWM signals) are supplied to control terminals (e.g. gate terminals) of the high-side switch 112 and low-side switch 114 of the half-bridge 210. The control signals are arranged such that when the high-side switch 212 is switched on in response to a control signal at its control terminal, the low-side switch 214 is switched off, and vice versa. Thus, in operation of the half-bridge 210, the output node 216 will be at either the first supply voltage (+VDD) or the second supply voltage (−VDD), depending upon whether the high-side switch 212 or the low-side switch 214 is switched on. The output voltage Vout across the load 230 can thus take one of two levels: +VDD or −VDD.

In some examples the single-ended output stage 200 may be implemented in integrated circuitry (e.g. as a single integrated circuit incorporating the high-side switch 212 and the low-side switch 214, and perhaps also modulator circuitry for generating the control signals that are supplied to the switches 212, 214), but the low-pass filter circuitry 240 is typically implemented using discrete components that are not implemented in integrated circuitry—i.e. the inductor 242 and capacitor 244 of the low-pass filter circuitry 240 are typically off-chip devices. However, in other examples the single-ended output stage 200 may be implemented entirely using off-chip devices, particularly in high-power applications where the cost of on-chip switches may be greater than that of off-chip switches.

A disadvantage of the single-ended output stage 200 of FIG. 2 is that a ripple current flows through the load 230, because the repeated switching of the output voltage Vout between +VDD and −VDD gives rise to a varying current through the inductor 242 of the low-pass filter circuitry 240, which manifests as ripple current through the load 230. This load ripple current can lead to power ($I^2R$) losses which can be significant, particularly in higher power use cases such as automotive applications.

SUMMARY

According to a first aspect, the invention provides a switching transducer driver operable in: a first mode in which first and second output stage switches are controlled to generate a two-level output signal, wherein an impedance of the first output stage switch is substantially the same as an impedance of the second output stage switch; and a second mode in which the first and second output stage switches and a third switch are controlled to generate a three-level output signal, wherein an impedance of the third switch is substantially greater than the impedance of the first output stage switch and the second output stage switch.

The switching transducer driver may be operable at a first frequency in the first mode, and may be operable at a second frequency in the second mode.

The second frequency may be lower than the first frequency.

The first output stage switch and the second output stage switch may be implemented using wide bandgap or high electron mobility transistor (HEMT) devices.

The impedance of the third switch may be at least twice the impedance of the first output stage switch and/or the second output stage switch.

The switching transducer driver may comprise control circuitry configured to select between the first mode and the second mode based on a parameter of an input signal to the switching transducer driver.

The parameter of the input signal may comprise a magnitude, level, envelope or volume of the input signal.

The control circuitry may comprise modulator circuitry configured to receive the input signal and a carrier wave signal and to generate a modulated output signal based on the input signal and the carrier wave signal.

The modulator circuitry may comprise: a variable phase shift element configured to generate a phase shifted version of the carrier wave signal; a first comparator configured to generate a first comparator output signal based on a comparison of the input signal and the carrier wave signal; and a second comparator configured to generate a second comparator output signal based on a comparison of the input signal and the phase shifted version of the carrier wave signal, wherein the modulated output signal is based on the first comparator output signal and the second comparator output signal.

The control circuitry may be operative to generate a control signal for controlling a phase shift applied by the variable phase shift element to the carrier wave signal to generate the phase shifted version of the carrier wave signal, wherein the control signal is based on the parameter of the input signal.

The control signal may represent a variable $\alpha$ that controls the phase shift applied by the variable phase shift element.

The variable $\alpha$ may be based on a comparison of the parameter of the input signal to a threshold such that the variable $\alpha$ is equal to 0 if the parameter of the input signal is equal to or greater than a first threshold, and is equal to 1 if the parameter of the input signal is less than the first threshold.

A value of $\alpha$ may be variable over a continuous range based on the parameter of the input signal, wherein the continuous range is between 0 and an upper limit value which is equal to or less than 1.

The modulator circuitry may comprise open loop modulator circuitry.

The switching transducer driver may be operable in a third mode in which an output of the switching transducer driver is clamped to a reference voltage.

The switching transducer driver may be configured to operate in the third mode if a parameter of the input signal is less than a second threshold.

The third switch may be of a different device type or technology than the first and second output stage switches.

The third switch may be implemented using one or more MOSFET devices.

The third switch may be implemented using a wide bandgap or HEMT device, wherein a characteristic of the third switch is inferior to a corresponding characteristic of the first and second output stage switches.

The third switch may be implemented as back-to-back coupled switches.

According to a second aspect, the invention provides a module comprising a substrate on which the third switch and the first and second output stage switches of the switching transducer driver of the first aspect are mounted.

According to a third aspect, the invention provides a switching transducer driver operable in: an active mode in which first and second output stage switches are controlled to generate a two-level output signal; and a quiescent mode in which a third switch is controlled to clamp an output of the switching transducer driver to a reference voltage.

According to a fourth aspect, the invention provides an integrated circuit comprising: control circuitry for supplying control signals to a first output stage switch, a second output stage switch and a third switch, wherein an impedance of the first output stage switch is substantially the same as an impedance of the second output stage switch and an impedance of the third switch is greater than the than the impedance of the first output stage switch and the second output stage switch, wherein the control circuitry is operable to select between a first mode of operation in which the first and second output stage switches are controlled to generate a two-level output signal and a second mode of operation in which the first and second output stage switches and a third switch are controlled to generate a three-level output signal.

The integrated circuit may comprise the third switch.

According to a fifth aspect, the invention provides a host device comprising the switching transducer driver of the first aspect.

The host device may comprise a laptop, notebook, netbook or tablet computer, an automotive system, an audio system for a vehicle, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

According to a sixth aspect, the invention provides Class D amplifier circuitry configured to receive an input signal and to output an output signal, the Class D amplifier circuitry comprising: a first output stage switch; a second output stage switch; and a third switch, wherein a characteristic of the third switch is inferior to a corresponding characteristic of the first and second output stage switches, and wherein the Class D amplifier circuitry is selectively operable in either a first mode of operation or a second mode of operation based on a parameter of the input signal.

According to a seventh aspect, the invention provides class D amplifier circuitry configured to receive an input signal and to output an output signal, the Class D amplifier circuitry comprising: a first output stage switch; a second output stage switch; a third switch; and control circuitry, wherein the first and second output stage switches are implemented using wide bandgap or high electron mobility transistor (HEMT) devices, and wherein the control circuitry is configured to select between a first mode of operation and a second mode of operation of the Class D amplifier circuitry based on a parameter of the input signal.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the invention will now be described, strictly by way of example only, with reference to the accompanying drawings, of which:

FIG. 1 is a schematic representation of a full-bridge output stage for use as a Class D amplifier output stage;

FIGS. 6a and 6b illustrate different approaches to switching between operating modes of the switching transducer driver of FIG. 3.

DETAILED DESCRIPTION

Figure 2:
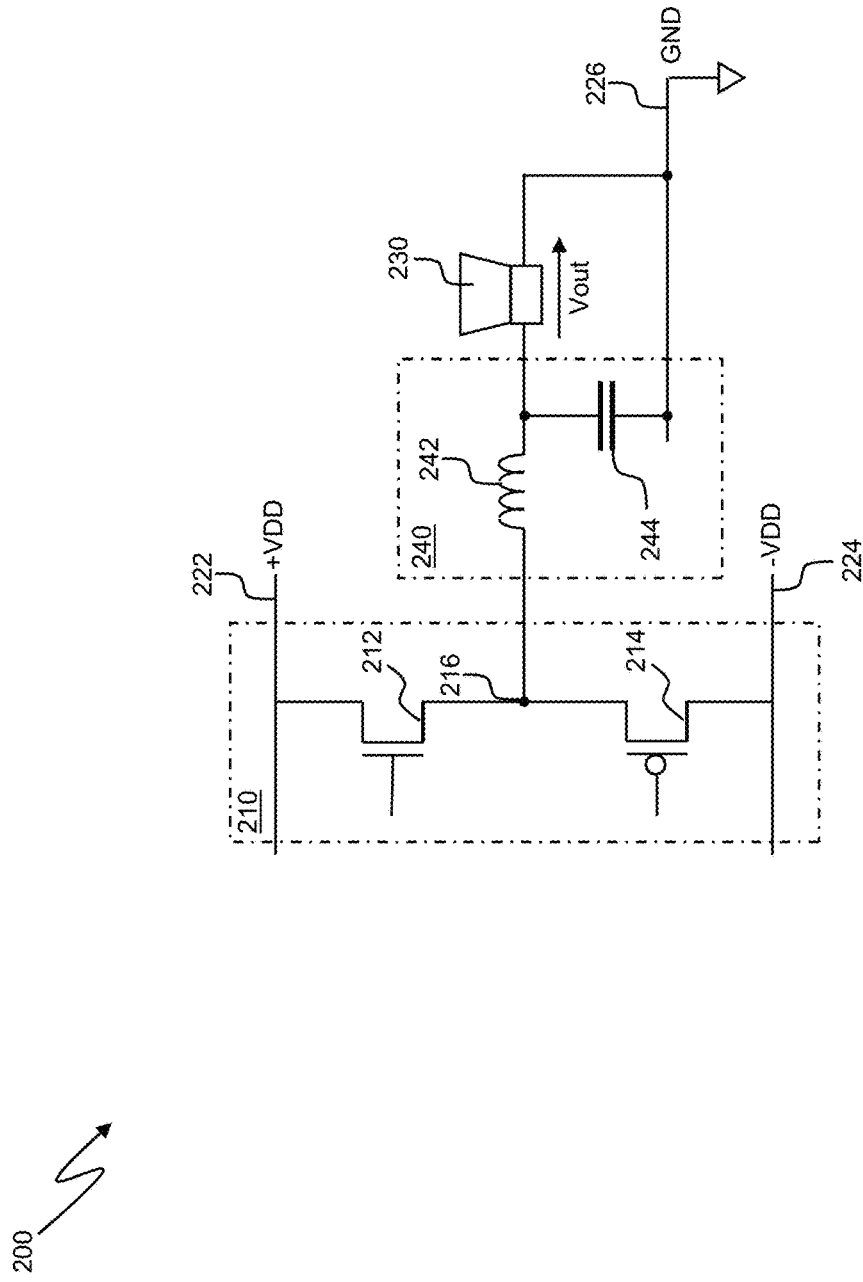
FIG. 2 is a schematic representation of a half-bridge output stage for use as a Class D amplifier output stage.
Figure 3:
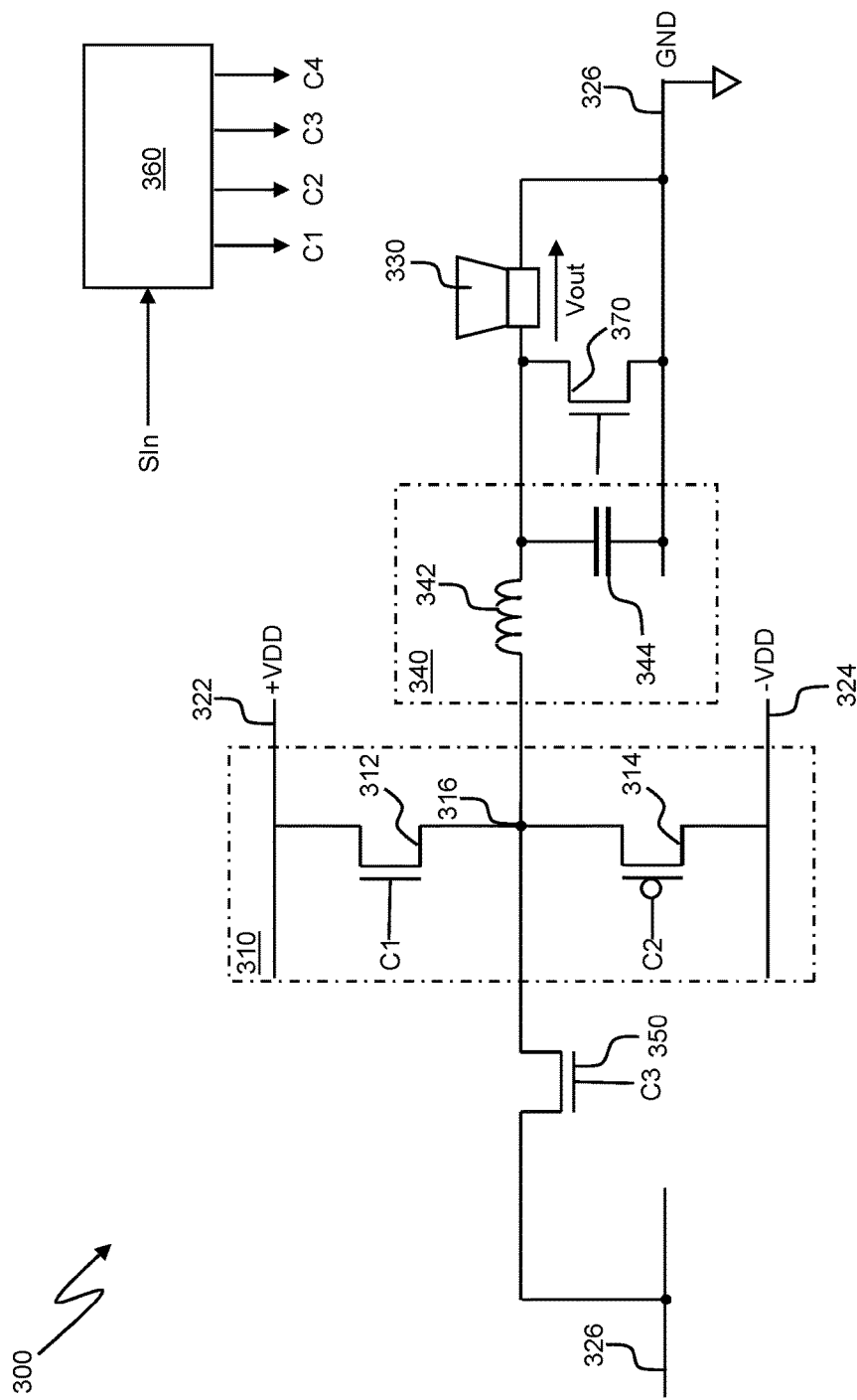
FIG. 3 is a schematic representation of a switching transducer driver circuitry according to the present disclosure.

FIG. 3 is a schematic representation of switching transducer driver according to the present disclosure.

The switching transducer driver in this example is implemented as Class D amplifier circuitry, which is shown generally at 300 in FIG. 3. The Class D amplifier circuitry 300 comprises a half-bridge 310 comprising a high-side switch 312 and a low-side switch 314 coupled in series between a first, positive (+VDD) power supply rail 322 and a second, negative (−VDD) power supply rail 324, with an output node 316 of the half-bridge 310 being coupled, via low-pass filter circuitry 340 (which comprises an inductor 342 and a capacitor 344) to a first terminal of a load 330, the load having a second terminal coupled to a reference voltage (e.g. ground) rail 326.

The Class D amplifier circuitry 300 of FIG. 3 further comprises a third switch 350, having an input terminal coupled to the reference voltage (e.g. ground) rail 326 and an output terminal coupled to the output node 316 of the half-bridge 310.

The Class D amplifier circuitry 300 further comprises control circuitry 360 configured to control a mode of operation of the Class D amplifier circuitry 300. In some examples, the control circuitry 360 may control the mode of operation of the Class D amplifier circuitry 300 based on a parameter such as a signal level, magnitude, envelope or volume of an input signal.

The Class D amplifier circuitry 300 of FIG. 3 is configured for operation with relatively high output power. For example, the positive power supply voltage +VDD and the negative power supply voltage −VDD may each have a magnitude of 50V DC or more. The high-side switch 312 and the low-side switch 314 are thus configured for operation at such voltages. In some examples the high-side switch 312 and the low-side switch 314 may be wide bandgap devices or high electron mobility transistor (HEMT) devices based on, for example, Gallium Nitride (GaN), Silicon Carbide (SiC), Gallium Oxide ($Ga_2O_3$) or other semiconductor materials. Such devices are typically capable of operation at higher voltages, higher temperatures and higher frequencies than silicon-based switches such as MOSFETs, and so for high power applications (e.g. applications in which the supply voltage magnitude is equal to or greater than 50V DC) may provide a more cost effective solution than silicon-based devices. The circuit area occupied by the switches 312, 314 in a switching transducer driver of the kind shown in FIG. 3 may be minimised or at least reduced by using switches having higher resistance, but as the resistance of the switches increases the supply voltage also increases. For example, if the resistance of the switches 312, 314 were doubled, the required supply voltage would also double. This trade-off between switch size and supply voltage is manageable and acceptable if the switches 312, 314 are implemented as GaN devices.

In use of the Class D amplifier circuitry 300, control signals C1, C2, C3 are supplied by the control circuitry 360 to control terminals of the high-side switch 312, the low-side switch 314 and the third switch 350 respectively. The control signals C1, C2, C3 are arranged such that only one of the high-side switch 312, the low-side switch 314 and the third switch 350 can be switched on at once, so the output voltage Vout across the load 330 may take one of three values: +VDD (when the high-side switch 312 is switched on and the low-side switch 314 and the third switch 350 are both switched off), −VDD (when the low-side switch 314 is switched on and the high-side switch 312 and the third switch 350 are both switched off), or 0V (when the high-side switch 312 and the low-side switch 314 are both switched off and the third switch 350 is switched on). These three output voltage values may be used to encode three different values. For example, an output voltage of +VDD may represent a value of +1, an output voltage of −VDD may represent a value of −1 and an output voltage of 0 may represent a value of 0.

The Class D amplifier circuitry 300 is thus capable of operating in a first mode with two output voltage levels, if the third switch 350 is held open (i.e. switched off). The Class D amplifier circuitry 300 can also operate in a second mode with three output voltage levels. In applications such as audio amplification, at high input signal levels (e.g. high-volume audio signals) only the +VDD and −VDD output voltages may be required, because at high input signal levels there will be relatively few input signal states that require the 0V output stage. In contrast, at lower input signal levels (e.g. lower volume audio signals) the 0V output voltage may also be required, because at low input signal levels there will be more input signal states that require the 0V output stage.

Thus, the control circuitry 360 may be operative to control a mode of operation of the Class D amplifier circuitry 300 based on a level of an input signal level SIn. If a parameter (e.g. a level, a magnitude, an envelope, a volume or some other property or parameter of the input signal) of the input signal is equal to or greater than a threshold, the control circuitry 360 may be operative to generate control signals C1, C2, C3 to cause the Class D amplifier circuitry 300 to operate in its first mode with two output signal levels. In this case, the control signal C3 supplied to the third switch 350 causes the third switch 350 to be held in an open or off state, to prevent the output node 316 from being coupled to the reference voltage (e.g. ground) rail 326 and thus prevent the 0V output state from being achievable. In contrast, if the parameter of the input signal is below the threshold, the control circuitry 360 may be operative to generate control signals C1, C2, C3 to cause the Class D amplifier circuitry 300 to operate in its second mode, with three output signal levels.

The control circuitry 360 may comprise pulse width modulator circuitry for generating a PWM signal S based on an input signal and one or more carrier wave signals. The control circuitry 360 may further comprise logic circuitry for generating the control signals C1, C2, C3 from the PWM signal generated by the pulse width modulator circuitry.

An advantage of operating in the first mode with only two output signal levels is increased linearity, in comparison to operating in the second mode with three output signal levels. Switching between two different voltages is inherently linear, but switching between three may require matching of components to produce linearized output. This is of particular significance when the switches 312, 314 are off-chip, and when a modulator/amplifier (e.g. the PWM modulator circuitry of the control circuitry 360) is operating in open-loop mode.

Figure 4:
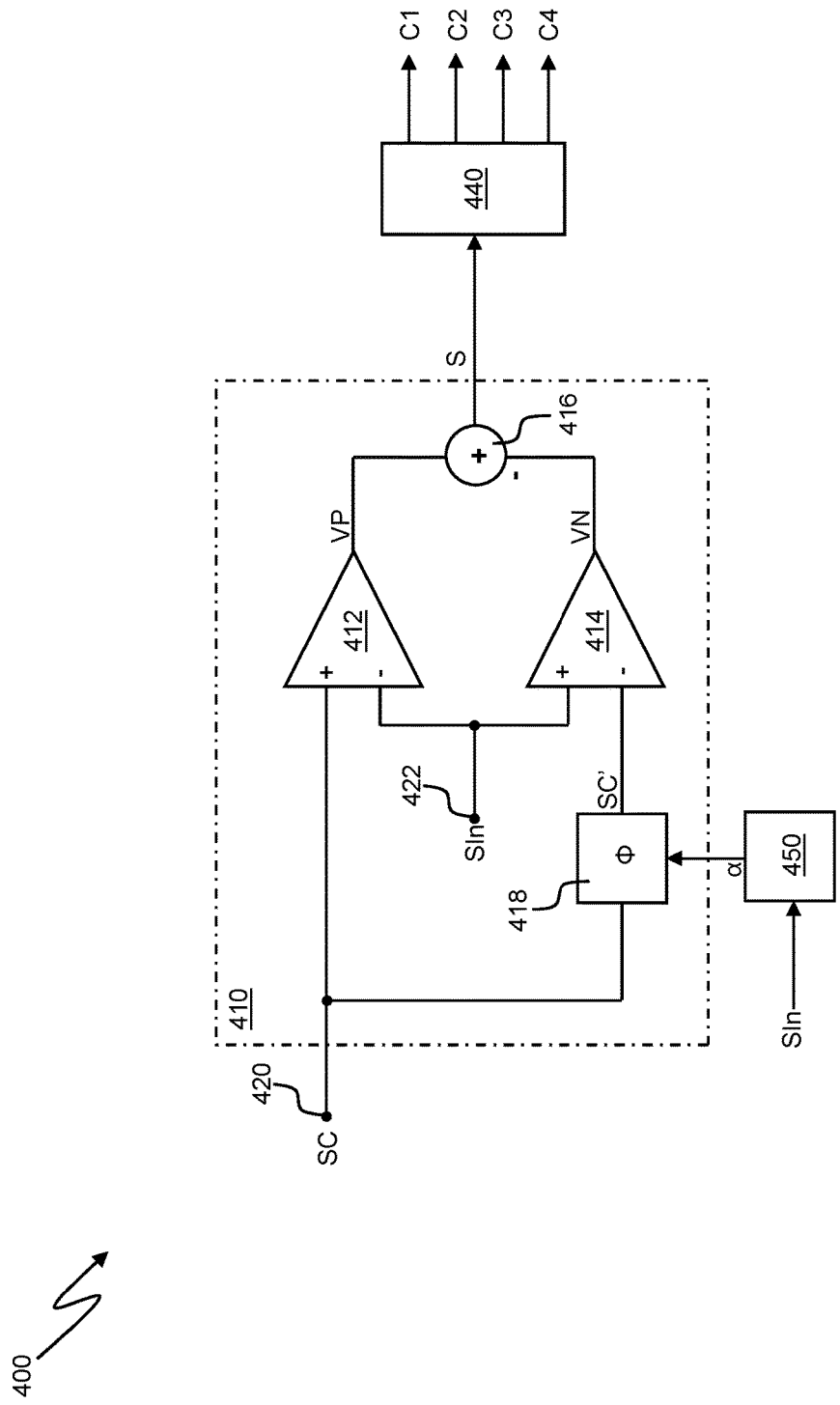
FIG. 4 is a schematic representation of control circuitry for supplying control signals for the switching transducer driver of FIG. 3.

FIG. 4 is a schematic representation of control circuitry for the Class D amplifier circuitry 300 of FIG. 3. As shown generally at 400 in FIG. 4, the control circuitry in this example includes open-loop PWM modulator circuitry 410, logic circuitry 440 and phase shift control circuitry 450.

The PWM modulator circuitry 410 in this example includes first and second comparators 412, 414, a subtractor 416 and a variable phase shift element 418. An input of the variable phase shift element 418 is coupled to a carrier wave input node 420 of the PWM modulator circuitry 410, and an output of the variable phase shift element 418 is coupled to an inverting (−) input of the second comparator 414. The carrier wave input node 420 is also coupled to a non-inverting (+) input of the first comparator 412. An input signal node 422 is coupled to an inverting (−) input of the first comparator 412 and to a non-inverting (+) input of the second comparator 414. Outputs of the first and second comparators 412, 414 are coupled to respective first and second inputs of the subtractor 416. An output of the subtractor 416 is coupled to an input of the logic circuitry 440.

In use of the control circuitry 400, a carrier wave signal SC, which may be, for example, a triangle wave signal, a sawtooth wave signal or some other cyclical reference signal, is supplied to the carrier wave input node 420 of the PWM modulator circuitry 410 and is thus transmitted to the non-inverting (+) input of the first comparator 412 and to the input of the variable phase shift element 418.

The variable phase shift element 418 is configured to apply a phase shift $\phi$ of between 0 and $\pi$ (i.e. between 0 and 180°) to the carrier wave signal SC received at its input, and to output a phase shifted version SC' of the carrier wave signal SC to the inverting (−) input of the second comparator 414. As will be appreciated by those of ordinary skill in the art, the variable phase shift element 418 may be implemented in a variety of ways. For example, the variable phase shift element 418 may be implemented by programmable delay circuitry, all-pass filter circuitry with a variable phase, unity gain amplifier circuitry with a variable phase, or the like.

The phase shift $\phi$ applied by the variable phase shift element 418 can be defined as $\phi=\alpha.\pi$, where $\alpha$ is a variable having a value between 0 and 1 that is dependent upon a parameter of an input signal SIn. For example, $\alpha$ may be dependent upon a magnitude, level, envelope or volume of the input signal SIn, such that the phase shift $\phi$ applied by the variable phase shift element is dependent on the magnitude, level, envelope or volume of the input signal SIn. The variable phase shift element 418 receives, from the phase shift control circuitry 450, a control signal indicative of the value $\alpha$ and controls or adjusts the phase shift $\phi$ applied to the received carrier wave signal SC based on this received control signal.

The input signal SIn, which may be, for example, an audio input signal, is supplied to the input signal node 422 and is thus transmitted to the inverting (−) input of the first comparator 412 and to the non-inverting (+) input of the second comparator 414.

The first comparator 412 thus generates a first comparator output signal VP based on a comparison of the input signal SIn to the carrier wave signal SC, where the first comparator output signal VP takes a high value (e.g. logic 1) if the magnitude of the carrier wave signal SC is greater than that of the input signal SIn, and the first comparator output signal VP takes a low value (e.g. logic 0) if the magnitude of the carrier wave signal SC is less than that of the input signal SIn. This can be expressed as VP=SC−SIn>0.

Similarly, the second comparator 414 generates a second comparator output signal VN based on a comparison of the input signal SIn to the phase shifted version SC' of the carrier wave signal SC, where the second comparator output signal VN takes a high value (e.g. logic 1) if the magnitude of the input signal SIn is greater than that of the phase shifted version SC' of the carrier wave signal SC, and the second comparator output signal VN takes a low value (e.g. logic 0) if the magnitude of the input signal SIn is less than that of the phase shifted version SC' of the carrier wave signal. This can be expressed as $VN=SIn-SCe^{-i\Phi}>0$.

The subtractor 416 subtracts the second comparator output signal VN from the first comparator output signal VP to generate the PWM output signal S, such that S=VP−VN.

The PWM output signal S is received by the logic circuitry 440, which is configured to generate the control signals C1, C2, C3 for the switches 312, 314, 350 of the Class D amplifier circuitry 300 based on the received PWM output signal S.

Figure 5:
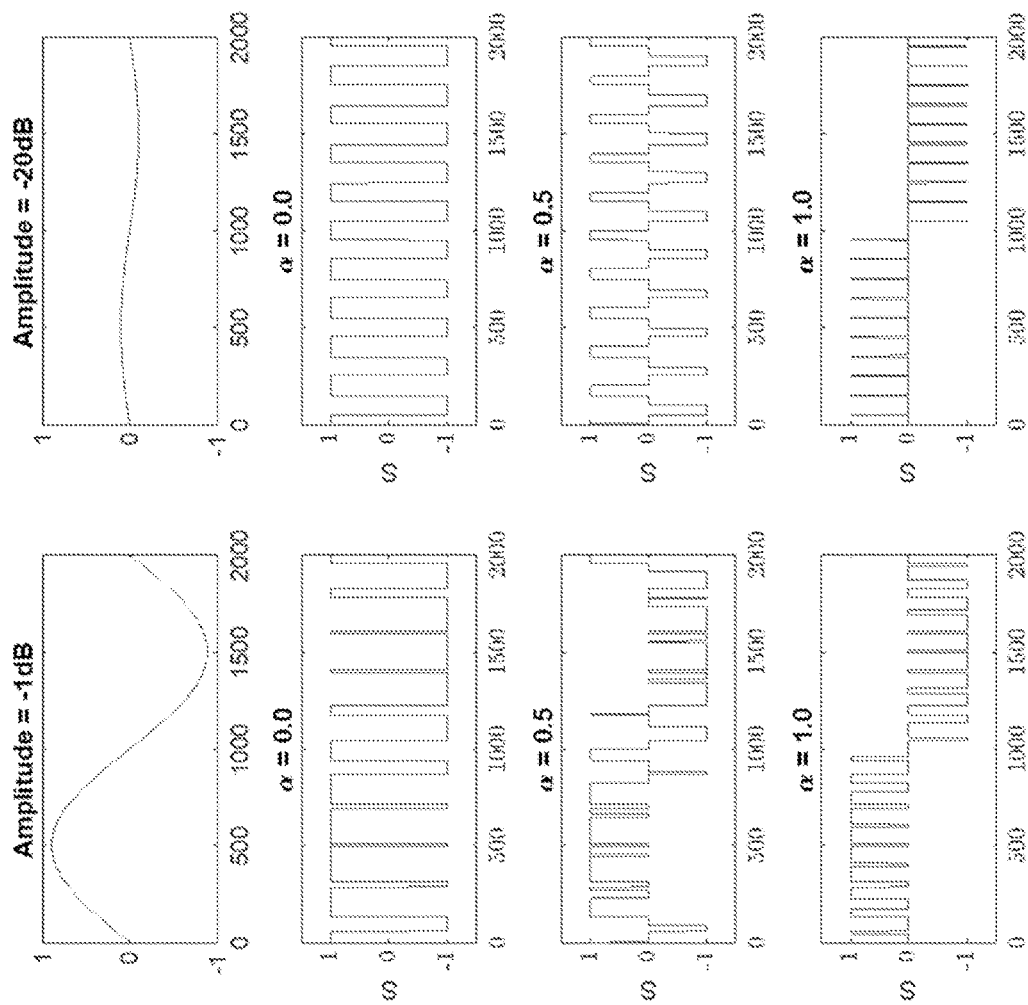
FIG. 5 shows the effect of different values of a variable α on an output signal of modulator circuitry of the control circuitry of FIG. 4.

FIG. 5 shows the effect of different values of $\alpha$ on the output signal S. As will be apparent from the signal traces shown in FIG. 5, when $\alpha$ is equal to 0, the PWM output signal S can adopt one of two states (i.e. the modulator circuitry 410 operates as a two-level modulator), shown as +1 and −1 in FIG. 5. Thus, when $\alpha$ is equal to 0, the Class D amplifier circuitry 300 operates in its first mode, in which the output signal supplied to the load 330 can take one of two levels, based on a state (on/off) of each of the high-side switch 312 and the low-side switch 314.

In contrast, when α is greater than 0, the PWM output signal S can adopt any one of three states (i.e. the modulator circuitry 410 operates as a three-level modulator), shown as +1, −1 and 0 in FIG. 5, with the occurrence of the 0 state being more frequent for higher values of α. Thus, when α greater than 0, the Class D amplifier circuitry 300 operates in its second mode, in which the output signal supplied to the load 330 can take one of three levels, based on a state (on/off) of each of the high-side switch 312, the low-side switch 314 and the third switch 350.

The logic circuitry 440 is configured to generate the control signals C1, C2, C3 for the switches 312, 314, 350 of the Class D amplifier circuitry 300 based on the received PWM output signal S. For example, the logic circuitry 440 may be configured to output a control signal C1 that will cause the high-side switch 312 to switch on and to output control signals C2 and C3 that will cause the low-side switch 314 and the third switch 350 to switch off when the PWM output signal S adopts a first state (e.g. the +1 state shown in FIG. 5), to output a control signal C2 that will cause the low-side switch 314 to switch on and to output control signals C1 and C3 that will cause the high-side switch 312 and the third switch 350 to switch off when the PWM output signal S adopts a second state (e.g. the −1 state shown in FIG. 5), and to output a control signal C3 that will cause the third switch 350 to switch on and to output control signals C1 and C2 that will cause the high-side switch 312 and the low-side switch 314 to switch off when the PWM output signal S adopts a third state (e.g. the 0 state shown in FIG. 5).

As noted above, for input signals of relatively large magnitude, the 0 state of the PWM output signal S is typically not required. Thus, the phase shift ϕ may be set to 0 for such input signals. Conversely, for input signals of relatively lower magnitude, the 0 state of the PWM output signal may be required to a greater or lesser extent depending on the magnitude of the input signal. Thus, the phase shift ϕ may be set to be greater than 0 for such input signals.

To this end, the phase shift control circuitry 450 is configured to generate the control signal indicative of the value α based on a parameter such as a magnitude, level, envelope or volume of the input signal SIn. In some examples the phase shift control circuitry 450 is configured to compare the parameter of the input signal SIn to a first predefined threshold parameter value TH1 and to change the value α from 0 to 1 if the parameter of the input signal SIn is equal to or greater than the first predefined threshold parameter value TH1, as shown in FIG. 6a. In other examples the phase shift control circuitry 450 is configured to monitor the parameter of the input signal and adjust the value α over a continuous range between 0 and an upper limit value (e.g. 1) as a function of the parameter of the input signal, as illustrated in FIG. 6b. In both of these examples the phase shift control circuitry 450 is configured to determine the value α based on the parameter of the input signal SIn and to generate the control signal indicative of the value α for output to the variable phase shift element 418. In some examples it may be advantageous for the upper limit value of α to be less than 1 (e.g. the value α may be adjustable over a range between 0 and 0.8, 0.9 or some other upper limit value that is less than 1) to ensure that the phase shift ϕ cannot be π (180°), to prevent small pulses in the output signal S output by the modulator circuitry 410.

The point or threshold at which the modulator circuitry 410 should switch between two-level modulation and three level modulation of the input signal SIn is a function of the on-resistance of the third switch 350. This point or threshold should be selected to balance reducing ripple current through the load 330 (and the attendant distortion in the output of the load 330) and thus power consumption by the load due to resistive ($I^2R$) losses in the load 330 with increased power consumption due to increased resistive ($I^2R$) losses that may arise when the third switch 350 is used to provide the 0 state in the PWM output signal S, so as to achieve an overall reduction in the power consumption of the Class S amplifier circuitry 300.

In some examples, the Class D amplifier circuitry 300 may be operable in a third mode, in which the input of the Class D amplifier circuitry 300 (and possibly also the output of the Class D amplifier circuitry 300) is clamped to the reference voltage (e.g. ground) rail 326 or to some other reference voltage source. The third mode may be entered when a parameter of the input signal (e.g. a magnitude, signal level, envelope or volume) of the input signal SIn is less than a second predefined threshold parameter value TH2, indicating that the input signal SIn does not represent a signal to be amplified. Thus, when the parameter of the input signal SIn is less than the second predefined threshold parameter value TH2, the control circuitry 360 may output a control signal C3 to the third switch 350 to cause it to close, thus clamping the input of the Class D amplifier circuitry 300 to the reference voltage (e.g. ground) rail 326.

In some examples, the output of the Class D amplifier circuitry 300 may be clamped to the reference voltage (e.g. ground) rail 326 or to some other reference voltage source in the third mode of operation, in addition to or instead of clamping the input of the Class D amplifier circuitry 300. To this end, the Class D amplifier circuitry 300 may include a fourth switch 370 coupled between the output of the low-pass filter circuitry 340 and the reference voltage (e.g. ground) rail 326. When the parameter of the input signal SIn is less than the second predefined threshold parameter value TH2, the control circuitry 360 may output a control signal C4 to the fourth switch 370 to cause it to close, thereby clamping the output of the Class D amplifier circuitry 360 to the reference voltage (e.g. ground) rail 326.

In some examples, the Class D amplifier circuitry 300 may be operable only in the above-described first and third modes. In such examples, the first mode may be referred to as an active mode and the third mode may be referred to as a quiescent mode. In such examples, the control circuitry 360 may be operative to control the mode of operation of the Class D amplifier circuitry 300 based on a parameter of the input signal SIn. If a parameter (e.g. a level, a magnitude, an envelope, a volume or some other property or parameter) of the input signal SIn is equal to or greater than a threshold, the control circuitry 360 may be operative to generate control signals C1, C2, C3 to cause the Class D amplifier circuitry 300 to operate in its first (active) mode with two output signal levels. In this case, the control signal C3 supplied to the third switch 350 causes the third switch 350 to be held in an open or off state, to prevent the output node 316 from being coupled to the reference voltage (e.g. ground) rail 326 and thus prevent the 0V output state from being achievable. In contrast, if the parameter of the input signal is below the threshold, the control circuitry 360 may be operative to generate a control signal C4 to cause the Class D amplifier circuitry 300 to operate in its third (quiescent) mode, with the output of the Class D amplifier circuitry 300 clamped to the reference voltage (e.g. ground) rail 326 by closing the fourth switch 370. The control circuitry 360 may be operative to generate a control signal C3 to case the input of the Class D amplifier circuitry 300 also to be clamped to the reference voltage (e.g. ground) rail 326 in this mode.

In a practical implementation of the Class D amplifier circuitry 300 of FIG. 3, the high-side switch 312, the low-side switch 314 and the third switch 350 may be of the same device type or technology, but a characteristic of the third switch 350 may be inferior to a corresponding characteristic of the high-side switch 312 and the low-side switch 314 to minimise or at least reduce cost, in comparison to using devices having the same characteristics for each of the high-side switch 312, the low-side switch 314 and the third switch 350.

For example, to minimise or reduce the cost of the Class D amplifier circuitry 300, the high-side switch 312 and the low-side switch 314 may be implemented using wide bandgap or HEMT devices having an impedance (e.g. an on-resistance such as a drain-to-source resistance Rds) of the order of a few milliohms or tens of milliohms, whereas the third switch 350 may be implemented using a lower cost wide bandgap or HEMT device having a greater on-resistance of the order of tens or hundreds of milliohms. The on-resistance of the third switch 350 may be at least twice, and may be significantly more than twice, the on-resistance of the high-side switch 312 and the low-side switch 314. As an illustrative example, the on-resistance of the high-side switch 312 and the low-side switch may be of the order of 70 milliohms, whereas the on-resistance of the third switch 350 may be of the order of 140 milliohms or greater, e.g. 500 milliohms.

In such implementations of the Class D amplifier circuitry 300, the threshold at which the modulator circuitry 410 switches between two-level modulation and three level modulation should be selected such that the benefit of reduced output ripple current at low input signal levels outweighs the disadvantage of increased power consumption that arises as a result of the use of the third switch 350 (and its greater on-resistance) to provide the 0 state in the PWM output signal S at lower signal levels.

In other examples, the third switch 350 may be of a different device type or technology than the high-side switch 312 and the low-side switch 314. For example, the high-side switch 312 and the low-side switch 314 may be implemented using wide bandgap or HEMT devices (e.g. GaN-based devices), while the third switch 350 may be implemented using one or more MOSFET devices or one or more wide-bandgap or HEMT devices based on a different semiconductor material, e.g. SiN. In such examples, the threshold at which the modulator circuitry 410 switches between two-level modulation and three level modulation should again be selected to balance the benefit of reduced output ripple current at low input signal levels against the disadvantage of increased power consumption at low input signal levels.

Further, in such examples, the impedance (e.g. on-resistance) of the third switch 350 may not differ significantly from the corresponding impedance (e.g. on-resistance) of the high-side switch 312 and the low-side switch 314, but the third switch 350 may have a lower (perhaps significantly lower) maximum switching speed than the high-side switch 312 and the low side-switch 314. Thus, in such examples it may be beneficial to reduce a switching frequency, speed or edge rate of the control circuitry 360 when switching to three-level modulation, as the maximum switching speed that can be supported by the high-side switch 312 and low-side switch 314 may be greater than the maximum switching speed that can be supported by the third switch 350. Thus, reducing the switching speed or edge rate of the control circuitry 360 ensures that the control signals C1, C2, C3 output by the control circuitry 360 are at a switching speed or edge rate that can be accommodated by all the switches 312, 314, 350. For example, when operating in the first (two-level modulation) mode, the switching frequency, speed or edge rate may be of the order of 1 MHz or more, whereas when operating in the second (three-level modulation) mode, the switching frequency, speed or edge rate may be of the order of 100 KHz.

In some examples, particularly for low power applications, the high-side switch 312, low-side switch 314 and third switch may all be implemented using MOSFET devices. In such examples, the Class D amplifier circuitry 300 may be implemented in a single integrated circuit. The control circuitry 360 may also be implemented in the same integrated circuit as the Class D amplifier in such examples. In examples where only the third switch 350 is implemented using a MOSFET device, the third switch 350 may be implemented in integrated circuitry, e.g. in a single integrated circuit that may also implement the control circuitry 360.

The present disclosure thus extends to an integrated circuit comprising control circuitry of the kind described herein for supplying control signals to the high-side switch 312, low-side switch 314 and the third switch 350, where the control circuitry is operable to select between the above-described first and second modes of operation and/or between the above-described first and third modes of operation. The integrated circuit may include driver circuitry for driving control terminals (e.g. gate terminals) of the high-side switch 312 and the low-side switch 314. Additionally or alternatively, the integrated circuit may include the third switch 350.

The present disclosure extends to a module comprising a substrate such as a printed circuit board (PCB) or the like on which the third switch 350 (when implemented using a MOSFET device, either in discrete circuitry or integrated circuitry), the high-side switch 312 and the low-side switch 314 are mounted and coupled with suitable connecting circuitry such as conductive tracks or traces.

Figure 7:
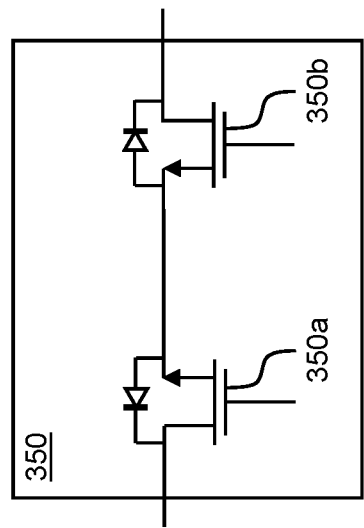
FIG. 7 is a schematic representation of a back-to-back switch arrangement that may be used in the switching transducer driver of FIG. 3.

In the example illustrated in FIG. 3, the third switch 350 is shown as a single switch. However, in some examples the third switch may be implemented as two back-to-back coupled switches, as shown in FIG. 7, to prevent reverse current flow through a body diode of the third switch 350 when the third switch 350 is switched off. Thus, the third switch 350 may be implemented by a combination of a first MOSFET device 350a and a second MOSFET device 350b, with source terminals of the first and second MOSFET devices 350a, 350b being coupled together such that, in the illustrated example, an anode of a body diode of the first MOSFET device 350a is coupled to an anode of a body diode of the second MOSFET device 350b. As will be appreciated by those of ordinary skill in the art, in other examples the first and second MOSFET devices 350a and 350b may be connected so that the direction of the body diode is reversed, in comparison with the example of FIG. 7, according to the structure of the gate driver for driving the switches.

In the example described above with reference to FIG. 4, the mode of operation of the switching transducer driver is controlled by adjusting a phase shift applied to a carrier wave that is supplied to the second comparator 414 of the PWM modulator circuitry 410. As will be appreciated by those of ordinary skill in the art, however, other approaches to controlling the mode of operation of a switching transducer are possible, e.g. using a self-oscillation modulator with coupled quantizers. Thus, it is to be appreciated that the PWM modulator circuitry 410 is only one example of a possible approach to controlling the mode of operation of the switching transducer driver of the present disclosure, and that alternative approaches could equally be employed.

The circuitry described above with reference to the accompanying drawings may be incorporated in a host device such as a laptop, notebook, netbook or tablet computer, an automotive system, e.g. as an audio system for a vehicle, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A switching transducer driver operable in:
   a first mode in which first and second output stage switches are controlled to generate a two-level output signal, wherein an impedance of the first output stage switch is substantially the same as an impedance of the second output stage switch; and
   a second mode in which the first and second output stage switches and a third switch are controlled to generate a three-level output signal, wherein an impedance of the third switch is substantially greater than the impedance of the first output stage switch and the second output stage switch;

wherein the switching transducer driver is operable in a third mode in which an output of the switching transducer driver is clamped to a reference voltage, and wherein the switching transducer driver is configured to operate in the third mode if a parameter of the input signal is less than a second threshold.

2. The switching transducer driver of claim 1, wherein the switching transducer driver is operable at a first frequency in the first mode, and is operable at a second frequency in the second mode.

3. The switching transducer driver of claim 2, wherein the second frequency is lower than the first frequency.

4. The switching transducer driver of claim 1, wherein the first output stage switch and the second output stage switch are implemented using wide bandgap or high electron mobility transistor (HEMT) devices.

5. The switching transducer driver of claim 1, wherein the impedance of the third switch is at least twice the impedance of the first output stage switch and/or the second output stage switch.

6. The switching transducer driver of claim 1, wherein the switching transducer driver comprises control circuitry configured to select between the first mode and the second mode based on a parameter of an input signal to the switching transducer driver.

7. The switching transducer driver of claim 6, wherein the parameter of the input signal comprises a magnitude, level, envelope or volume of the input signal.

8. The switching transducer driver of claim 6, wherein the control circuitry comprises modulator circuitry configured to receive the input signal and a carrier wave signal and to generate a modulated output signal based on the input signal and the carrier wave signal.

9. The switching transducer driver of claim 8, wherein the modulator circuitry comprises:
   a variable phase shift element configured to generate a phase shifted version of the carrier wave signal;
   a first comparator configured to generate a first comparator output signal based on a comparison of the input signal and the carrier wave signal; and
   a second comparator configured to generate a second comparator output signal based on a comparison of the input signal and the phase shifted version of the carrier wave signal,
   wherein the modulated output signal is based on the first comparator output signal and the second comparator output signal.

10. The switching transducer driver of claim 9, wherein the control circuitry is operative to generate a control signal for controlling a phase shift applied by the variable phase shift element to the carrier wave signal to generate the phase shifted version of the carrier wave signal, wherein the control signal is based on the parameter of the input signal.

11. The switching transducer driver of claim 10, wherein the control signal represents a variable $\alpha$ that controls the phase shift applied by the variable phase shift element, wherein the variable $\alpha$ is based on a comparison of the parameter of the input signal to a threshold such that the variable $\alpha$ is equal to 0 if the parameter of the input signal is equal to or greater than a first threshold, and is equal to 1 if the parameter of the input signal is less than the first threshold.

12. The switching transducer driver of claim 11, wherein a value of $\alpha$ is variable over a continuous range based on the parameter of the input signal, wherein the continuous range is between 0 and an upper limit value which is equal to or less than 1.

13. The switching transducer driver of claim 8, wherein the modulator circuitry comprises open loop modulator circuitry.

14. The switching transducer driver of claim 1, wherein the third switch is of a different device type or technology than the first and second output stage switches.

15. The switching transducer driver of claim 14, wherein the third switch is implemented using one or more MOSFET devices.

16. The switching transducer driver of claim 1, wherein the third switch is implemented as back-to-back coupled switches.

17. A module comprising a substrate on which the third switch and the first and second output stage switches of the switching transducer driver of claim 1 are mounted.

18. A host device comprising the switching transducer driver of claim 1.

19. The host device according to claim 18, wherein the host device comprises a laptop, notebook, netbook or tablet computer, an automotive system, an audio system for a vehicle, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

20. A switching transducer driver operable in:
   a first mode in which first and second output stage switches are controlled to generate a two-level output signal, wherein an impedance of the first output stage switch is substantially the same as an impedance of the second output stage switch; and
   a second mode in which the first and second output stage switches and a third switch are controlled to generate a three-level output signal, wherein an impedance of the third switch is substantially greater than the impedance of the first output stage switch and the second output stage switch,
   wherein the switching transducer driver comprises control circuitry configured to select between the first mode and the second mode based on a parameter of an input signal to the switching transducer driver,
   wherein the control circuitry comprises modulator circuitry configured to receive the input signal and a carrier wave signal and to generate a modulated output signal based on the input signal and the carrier wave signal.

* * * * *